United States Patent
Mallik et al.

(10) Patent No.: US 9,478,476 B2
(45) Date of Patent: Oct. 25, 2016

(54) PACKAGE FOR A MICROELECTRONIC DIE, MICROELECTRONIC ASSEMBLY CONTAINING SAME, MICROELECTRONIC SYSTEM, AND METHOD OF REDUCING DIE STRESS IN A MICROELECTRONIC PACKAGE

(75) Inventors: Debendra Mallik, Chandler, AZ (US); Sridhar Narasimhan, Chandler, AZ (US); Mathew J. Manusharow, Phoenix, AZ (US); Thomas A. Boyd, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 13/976,098

(22) PCT Filed: Dec. 16, 2011

(86) PCT No.: PCT/US2011/065512
§ 371 (c)(1),
(2), (4) Date: Jun. 26, 2013

(87) PCT Pub. No.: WO2013/089780
PCT Pub. Date: Jun. 20, 2013

(65) Prior Publication Data
US 2013/0270691 A1 Oct. 17, 2013

(51) Int. Cl.
| | |
|---|---|
| H01L 23/48 | (2006.01) |
| H01L 23/34 | (2006.01) |
| H01L 23/36 | (2006.01) |
| H01L 21/50 | (2006.01) |
| H01L 23/367 | (2006.01) |
| H01L 23/42 | (2006.01) |
| H01L 23/498 | (2006.01) |
| H01L 25/065 | (2006.01) |

(52) U.S. Cl.
CPC .............. *H01L 23/34* (2013.01); *H01L 21/50* (2013.01); *H01L 23/36* (2013.01); *H01L 23/3675* (2013.01); *H01L 23/42* (2013.01); *H01L 23/49833* (2013.01); *H01L 25/0655* (2013.01); *H01L 2224/16225* (2013.01); *H01L 2224/73253* (2013.01); *H01L 2924/01327* (2013.01)

(58) Field of Classification Search
CPC ....................................... H01L 23/34
See application file for complete search history.

(56) References Cited

U.S. PATENT DOCUMENTS

| | | | |
|---|---|---|---|
| 6,212,074 B1* | 4/2001 | Gonsalves | H01L 23/4006 165/185 |
| 6,229,216 B1* | 5/2001 | Ma et al. | 257/777 |
| 2004/0190259 A1 | 9/2004 | Labanok et al. | |
| 2007/0290338 A1* | 12/2007 | Kuczynski | H01L 23/26 257/737 |
| 2008/0001283 A1 | 1/2008 | Lee et al. | |
| 2010/0044856 A1* | 2/2010 | Sri-Jayantha et al. | 257/717 |

FOREIGN PATENT DOCUMENTS

WO 2013/089780 A1 6/2013

OTHER PUBLICATIONS

International Preliminary Report on Patentability received for International Application No. PCT/US2011/065512, mailed on Jun. 26, 2014, 8 pages.
International Search Report and Written Opinion received for International Application No. PCT/US2011/065512, mailed on Sep. 19, 2012, 11 pages.
Office Action Received for Korean Patent Application No. 2014-7016245 mailed on Jun. 15, 2015, 5 pages of Office Action and 5 pages of English Translation.
Office Action Received for Chinese Patent Application No. 201180075511.4 mailed on May 4, 2016, 7 pages of Office Action and 5 pages of English Translation.

* cited by examiner

*Primary Examiner* — William Harriston
(74) *Attorney, Agent, or Firm* — Kenneth A. Nelson

(57) ABSTRACT

A package for a microelectronic die (110) includes a first substrate (120) adjacent to a first surface (112) of the die, a second substrate (130) adjacent to the first substrate, and a heat spreader (140) adjacent to a second surface (111) of the die. The heat spreader makes contact with both the first substrate and the second substrate.

17 Claims, 7 Drawing Sheets

PACKAGE FOR A MICROELECTRONIC DIE, MICROELECTRONIC ASSEMBLY CONTAINING SAME, MICROELECTRONIC SYSTEM, AND METHOD OF REDUCING DIE STRESS IN A MICROELECTRONIC PACKAGE

FIELD OF THE INVENTION

The disclosed embodiments of the invention relate generally to microelectronic devices, and relate more particularly to packages for microelectronic devices.

BACKGROUND OF THE INVENTION

Integrated circuit dies and other microelectronic devices are typically enclosed within a package that, among other functions, enables electrical connections to be made between the die and a socket, a motherboard, or another next-level component. As die sizes shrink and interconnect densities increase, such electrical connections must be scaled so as to match both the smaller pitches typically found at the die and the larger pitches typically found at the next-level component. Patch-on-interposer (PoINT) is a technology designed to reduce package cost by introducing a high density flip chip patch on a low cost, low density interposer.

BRIEF DESCRIPTION OF THE DRAWINGS

The disclosed embodiments will be better understood from a reading of the following detailed description, taken in conjunction with the accompanying figures in the drawings in which:

FIGS. 1b and 1c are plan views of the assembly of FIG. 1a;

Figure 1A:
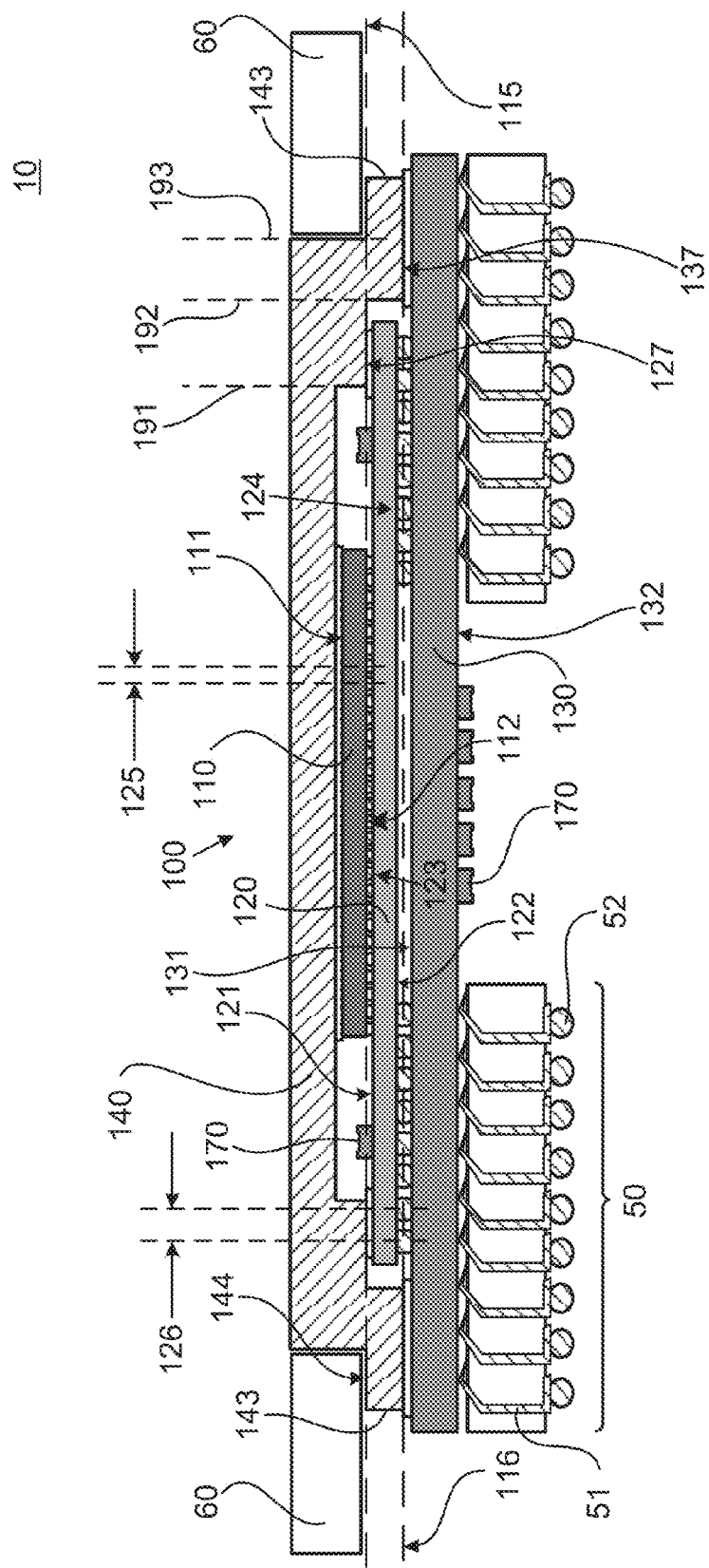
FIG. 1a is a cross-sectional view of a microelectronic assembly according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a package for a microelectronic die comprises a first substrate adjacent to a first surface of the die, a second substrate adjacent to the first substrate, and a heat spreader adjacent to a second surface of the die. The heat spreader makes contact with both the first substrate and the second substrate.

In certain other PoINT architectures, the heat spreader—also referred to herein as an integrated heat spreader, or IHS—is mounted onto the patch in order to manage die stress. This arrangement obliges the socket independent loading mechanism (ILM) to contact the IHS at a higher level than what is typical for a conventional land grid array (LGA) package because the addition of the patch means the PoINT package is thicker than the conventional LGA package. This arrangement can also lead to solder squeeze-out issues and/or cantilever effects. Still other PoINT architectures mount the IHS exclusively on the interposer. However, the large resulting die-to-IHS overhang leads to significant die-stress risks, including die-edge CDO (carbon-doped oxide) delamination. Additionally, high thickness tolerances of the combined patch and interposer structure results in significant risk for solder thermal interface material (STIM)

voiding, STIM non-wetting, and corner cracking. In addition to die stress issues, packages using the described PoINT architectures require dedicated ILMs. In other words, ILMs designed for conventional packages are not compatible with ILMs designed for PoINT packages, and vice versa.

Embodiments of the invention make use of an IHS with multi-level contact. These embodiments are designed such that the IHS makes contact with (i.e., rests on) the patch for die stress thickness tolerance management and also makes contact with (rests on) the interposer to provide ILM load support points. These embodiments make it possible for an ILM that is designed for a conventional LGA package to also work for a PoINT package and also make possible the realization of an interchangeable PoINT and conventional LGA package on the same system board. Some embodiments, in order to reduce package real estate requirements and/or IHS cost, eliminate the multi-level contact feature on sides that do not require ILM contact.

Figure 1B:
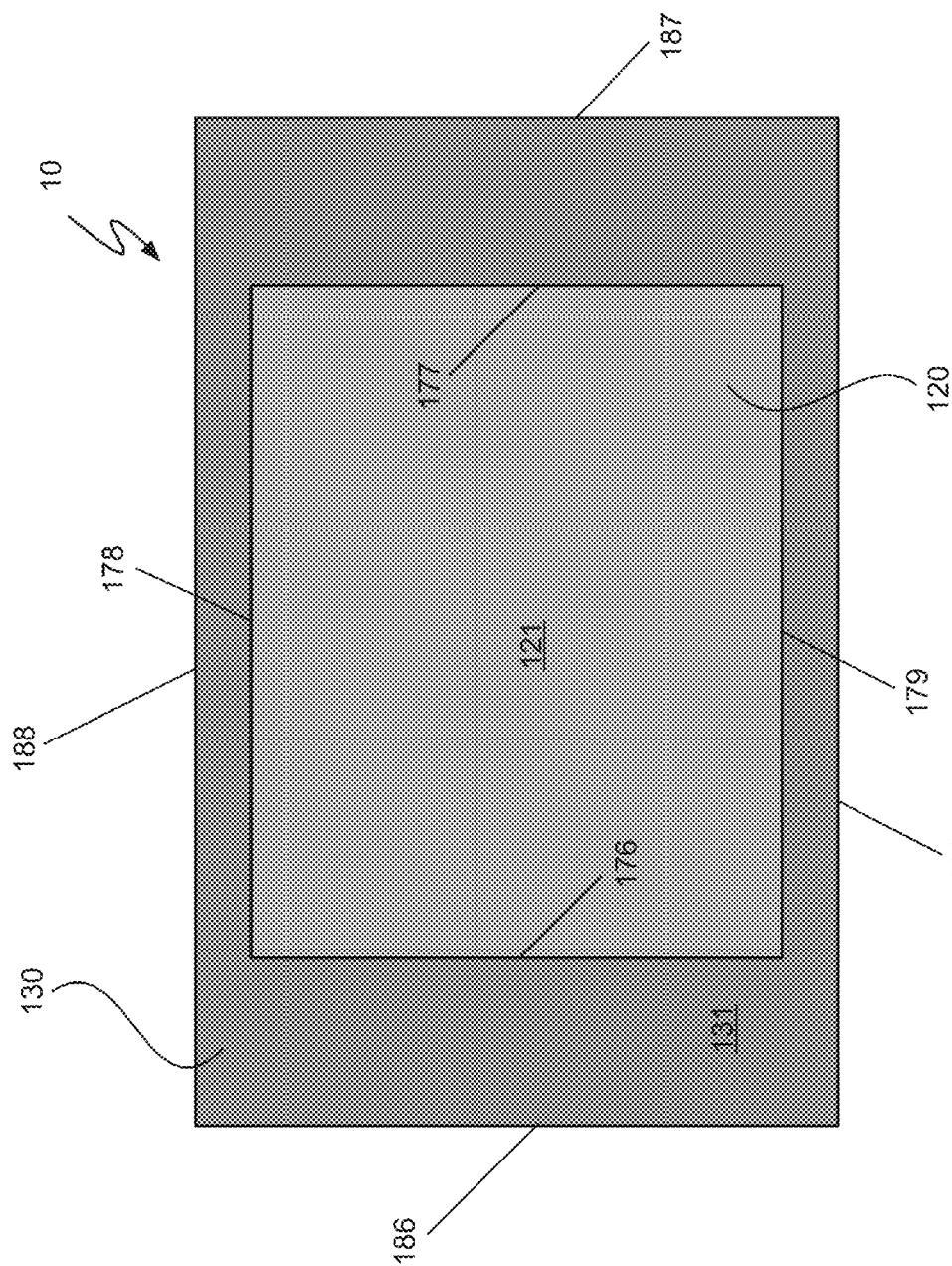
Figure 1C:
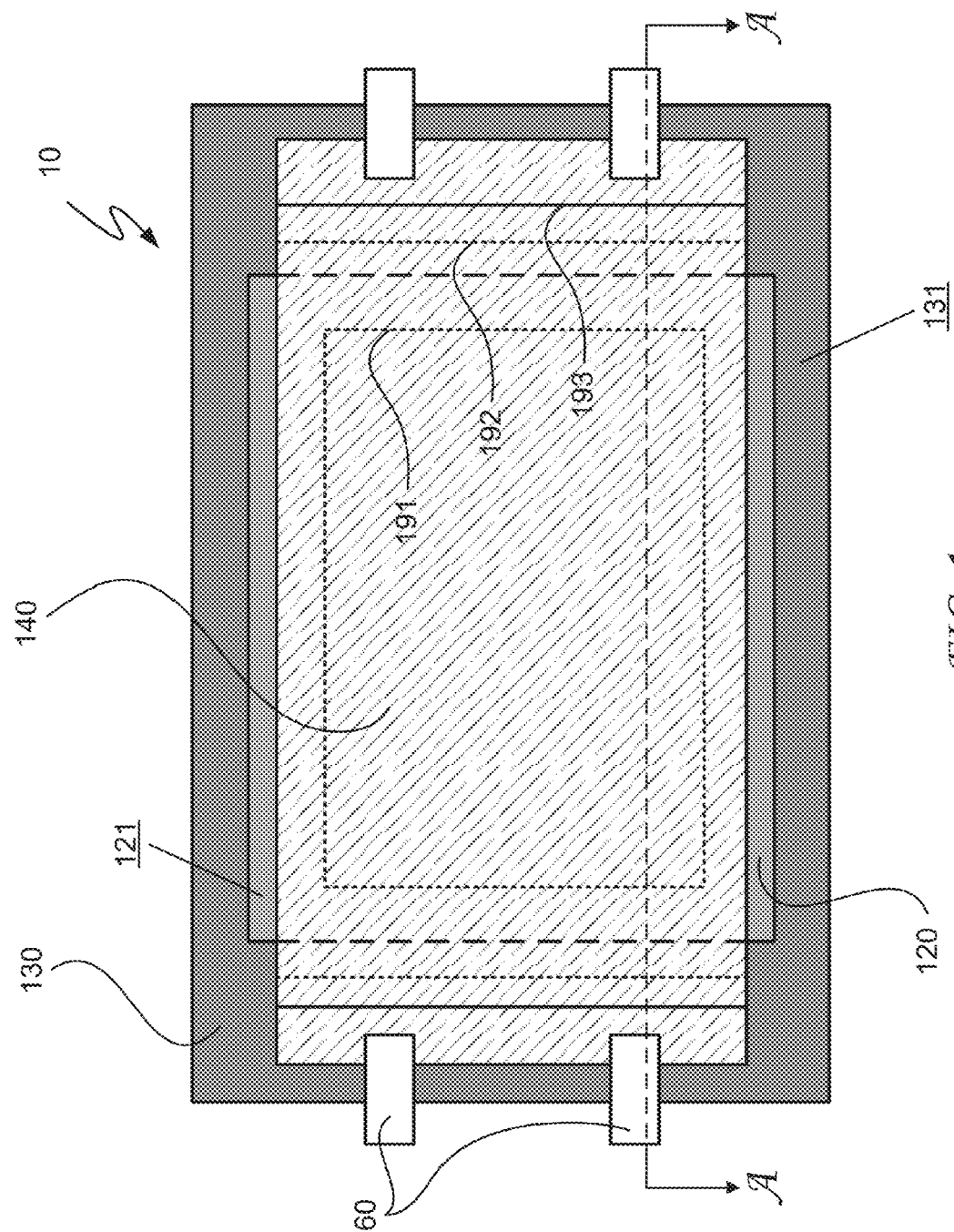

Referring now to the drawings, FIG. 1a is a cross-sectional view and FIGS. 1b and 1c are plan views of a microelectronic assembly 10 according to an embodiment of the invention. Microelectronic assembly 10 comprises a socket 50, an ILM 60, and an integrated circuit (IC) package 100. FIG. 1a is taken along a line A-A of FIG. 1c. In FIG. 1b the heat spreader (described below) that appears in FIGS. 1a and 1c is omitted so as to expose underlying features of package 100 that would otherwise be obscured.

As illustrated in FIGS. 1a-1c, package 100 comprises a microelectronic die 110 having a surface 111 and an opposing surface 112, a substrate 120 adjacent to surface 112 of the die, a substrate 130 adjacent to substrate 120, and a heat spreader 140 adjacent to surface 111 of die 110. In the nomenclature of the PoINT architecture, substrate 120 is the patch and substrate 130 is the interposer. Heat spreader 140 makes contact with both substrate 120 and substrate 130, that is, makes contact with both the patch and the interposer.

Although not shown in the figures, in one embodiment, a heat sink for other cooling device) may be thermally coupled with heat spreader 140, and a layer of thermal interface material (TIM) may be disposed between a surface of the heat spreader and the heat sink (or other device). By way of example, the heat sink may comprise a multi-fin (or multi-pin) heat sink secured over heat spreader 140 and die 110 by a retention mechanism.

Heat spreader 140 may be made of any suitable thermally conductive materials and may have any suitable shape or structure (as further discussed below). Materials that may be used to construct heat spreader 140 include metals (e.g., copper and alloys thereof), thermally conductive composites, and thermally conductive polymers. In one embodiment, a wetting layer (e.g., nickel) or other coating may be disposed over at least a portion of the heat spreader's surface.

Die 110 may comprise any type of integrated circuit device. In one embodiment, die 110 includes a processing system (either single-core or multi-core). For example, the die may comprise a microprocessor, a graphics processor, a signal processor, a network processor, a chipset, etc. In one embodiment, die 110 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of IC devices. For example, various embodiments may include multiple dies (e.g., multiple microprocessor dies or microprocessors and graphics processors) on the same substrate. Some such embodiments are further discussed below in connection with FIGS. 6 and 7.

Substrate 120 comprises a surface 121 and an opposing surface 122, where surface 121 is adjacent to surface 112 of die 110 and surface 122 is adjacent to substrate 130. Substrate 120 comprises a plurality of interconnects 123 having a pitch 125 at surface 121 and a plurality of interconnects 124 having a pitch 126 at surface 122, with pitch 125 being smaller than pitch 126. This is in keeping with a function—alluded to above—that the patch in PoINT technology is expected to perform: pitch translation from the fine pitch of the die to the larger pitch of the interposer.

In some embodiments, surface 112 may be referred to as the "active surface" of die 110. Interconnects 123 extend from the die's front side 112 to the underlying substrate 120, and these interconnects 123 electrically couple the die and substrate. Interconnects 123 may comprise any type of structure and materials capable of providing electrical communication between die 110 and substrate 120, and according to one embodiment, as illustrated in FIG. 1a, die 110 is disposed on substrate 120 in a flip-chip arrangement. In the illustrated embodiment, each of the interconnects 123 comprises an electrically conductive terminal on the die (e.g., pad, bump, stud bump, column, pillar, or other suitable structure or combination of structures) and a corresponding electrically conductive terminal on the substrate (e.g., a pad, bump, stud bump, column, pillar, or other suitable structure or combination of structures). Solder (e.g., in the form of balls or bumps) may be disposed on the terminals of the substrate and/or die, and these terminals may then be joined using a solder reflow process. Interconnects 124 are similar to interconnects 123, and the foregoing discussion (modified as appropriate for differences in location, pitch, function, etc.) also applies to these interconnects 124.

The terminals on die 110 may comprise any suitable material or combination of materials, whether disposed in multiple layers or combined to form one or more alloys and/or one or more intermetallic compounds. For example, the terminals on die 110 may include copper, aluminum, gold, silver, nickel, titanium, tungsten, as well as any combination of these and/or other metals. In other embodiments, a terminal may comprise one or more non-metallic materials (e.g., a conductive polymer). The terminals on substrate 120 may also comprise any suitable material or combination of materials, whether disposed in multiple layers or combined to form one or more alloys and/or one or more intermetallic compounds. For example, the terminals on substrate 120 may include copper, aluminum, gold, silver, nickel, titanium, tungsten, as well as any combination of these and/or other metals. Any suitable solder material may be used to join the mating terminals of die 110 and substrate 120, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

In one embodiment, the interconnects 123 electrically couple die 110 to substrate 120, and the interconnects 123 also aid in mechanically securing the die to the substrate. In a further embodiment, a layer of underfill material may be disposed around interconnects 123 and between die 110 and substrate 120, and this underfill layer may also aid in mechanically securing the die to the substrate. The underfill may comprise any suitable material, such as a liquid or a pre-applied epoxy compound.

Substrate 130 comprises a surface 131 and an opposing surface 132, where surface 131 is adjacent to surface 122 of substrate 120. Surface 132 is adjacent to socket 50, which comprises LGA contact pins 51 and solder balls 52. ILM 60 presses package 100 into socket 50, as discussed in more detail below. Package 100 may further comprise capacitors or other passive devices 170.

Substrate 130—sometimes referred to as a "package substrate" or, in PoINT technology as mentioned above), as an interposer—may comprise any suitable type of substrate capable of providing electrical communications between die 110 and a next-level component to which package 100 is coupled (e.g., a circuit board). In another embodiment, substrate 130 may comprise any suitable type of substrate capable of providing electrical communication between die 110 and an upper IC package coupled with the lower IC package, and in a further embodiment substrate 130 may comprise any suitable type of substrate capable of providing electrical communication between the upper IC package and a next-level component to which IC package 100 is coupled. Substrate 130 may also provide structural support for die 110. By way of example, in one embodiment, substrate 130 comprises a multi-layer substrate—including alternating layers of a dielectric material and metal—built-up around a core layer (either a dielectric or metal core). In another embodiment, substrate 130 comprises a careless multi-layer substrate. Other types of substrates and substrate materials may also find use with the disclosed embodiments (e.g., ceramics, sapphire, glass, etc.).

Surface 112 of die 110 defines a plane 115. Heat spreader 140 makes contact with substrate 120 at a contact area 127 and makes contact with substrate 130 at a contact area 137. Contact areas 127 and 137, along with surface 111 of die 110, are provided with an adhesive (shown in the figures but not designated with a reference numeral) designed to bond the heat spreader to the substrates and to the die. The adhesive could also, or instead, act as a thermal interface material. Accordingly, where the heat spreader is said to be in contact with other package components it should be understood that, at least in some embodiments, the adhesive and/or TIM is located in between the heat spreader and that other component.

As noted above, to thermally couple die 110 with heat spreader 140, a layer of thermal interface material may be disposed between the die's back side 111 and the adjacent surface of heat spreader 140. The TIM layer may comprise any suitable thermally conductive material capable of forming a thermally conductive (and perhaps mechanical) bond between die 110 and heat spreader 140. For example, the TIM layer may comprise a solder material, a composite material, a thermally conductive polymer, as well as any combination of these and/or other materials.

In the illustrated embodiment, contact area 127 is located in plane 115, and contact area 137 is located in a plane 116 that is parallel to plane 115. Also in the illustrated embodiment, contact area 137 is located at an edge 143 of heat spreader 140, and edge 143 contains a step 144 located above contact area 137. Step 144 of heat spreader 140 provides a landing zone or contact surface for ILM 60. In the illustrated embodiment, step 144 is located in plane 115. FIGS. 1a-1c thus illustrate a single-piece, single-step design for heat spreader 140. In a non-illustrated embodiment, contact area 127 may be located in a plane that is parallel to but different from plane 115 and that is closer to plane 115 than is plane 116. In either embodiment, step 144 is located so as to receive ILM. 60 at the same height, position, or level at which the ILM would also be located for conventional LGA packages, thus enabling the interchangeability—mentioned above—of PoINT and conventional LGA packages on the same system board. In various embodiments, locating step 144 in plane 115—i.e., level with, or within roughly 100 micrometers of, surface 112 of die 110—is what allows this ILM interchangeability.

A principal function of an ILM is to deliver the force necessary to seat a processor package onto the socket contacts and to distribute the resulting load evenly through the socket solder balls. In the context of FIG. 1a, ILM 60 urges package 100 onto LGA contact pins 51 and distributes the resulting load through socket solder balls 52. Typically, as in the illustrated case, the ILM makes contact with package 100 on just two of its four sides. This configuration means that multi-level IHS contact is less important—or not important—on those sides of the package with no ILM presence and therefore, as mentioned above, some embodiments eliminate the multi-level contact feature on those sides. This may be seen by referring to FIGS. 1b and 1c, as further discussed below.

With particular reference first to FIG. 1b, surface 121 of substrate 120 comprises a side 176, a side 177 opposite side 176, a side 178 extending between side 176 and side 177, and a side 179 opposite side 178. Similarly, surface 131 of substrate 130 comprises a side 186, a side 187 opposite side 186, a side 188 extending between side 186 and side 187, and a side 189 opposite side 188. Referring now in particular to FIG. 1c (where reference numerals indicating the four sides of each of surfaces 121 and 131 have been omitted for clarity), it may be seen that heat spreader 140 makes contact with surface 121 at sides 176 and 177 but not at sides 178 and 179, and with surface 131 at sides 189 and 187 but not at sides 188 and 189. In various non-illustrated embodiments, the heat spreader may make contact with surface 121 at two, three, or all four sides and with surface 131 at two, three, or all four sides, in any combination. Referring still to FIG. 1c, a line 191 indicates the location where heat spreader 140 turns down to meet substrate 120, a line 192 indicates the location where heat spreader 140 turns down again to meet substrate 130, and a line 193 indicates an innermost extent of step 144. Corresponding lines are indicated in FIG. 1a.

Figure 2:
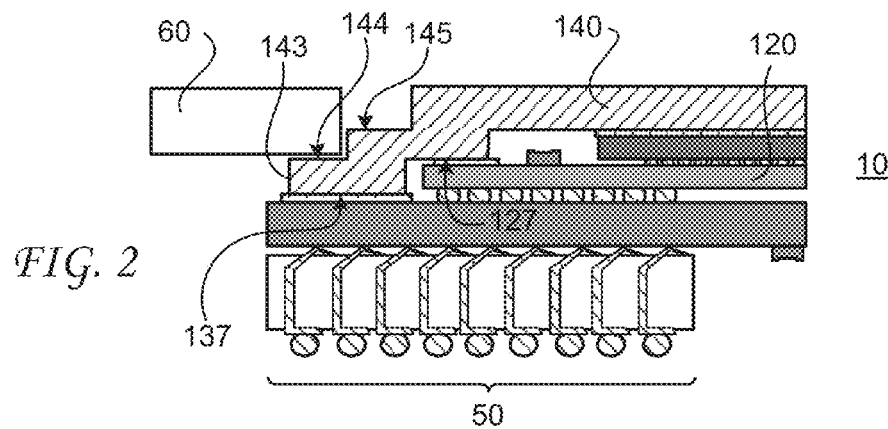
FIGS. 2-4 are cross-sectional views of portions of the assembly of FIGS. 1a-1c according to various alternative embodiments of the invention.
Figure 3:
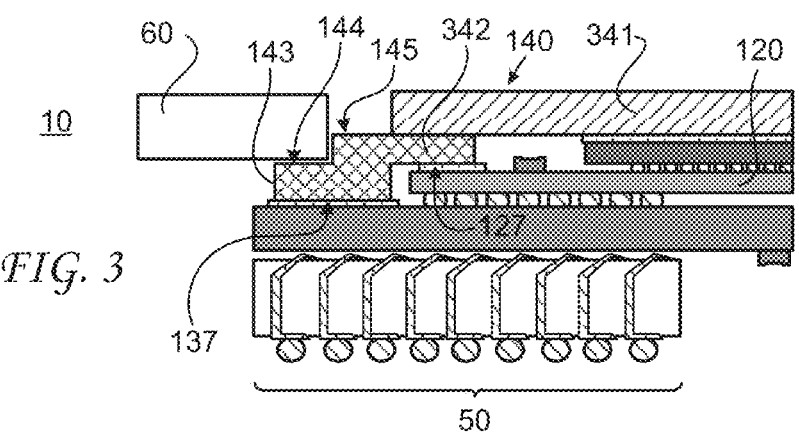
Figure 4:
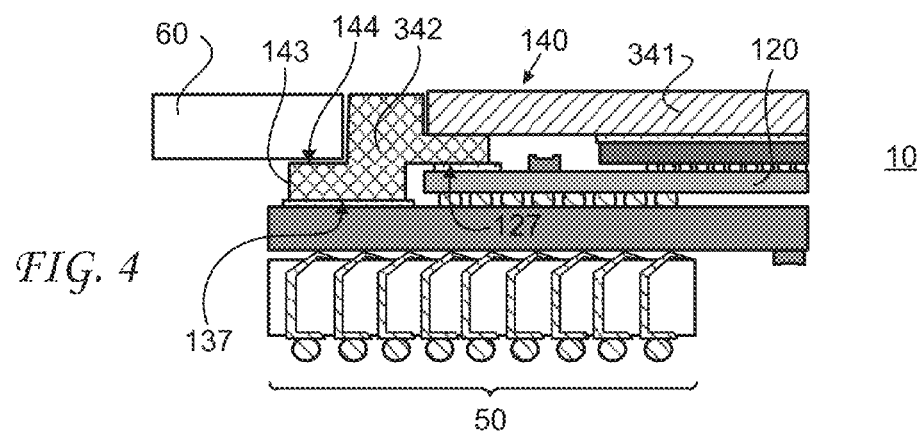

FIGS. 2-4 are cross-sectional views of portions of assembly 10 according to various alternative embodiments of the invention. In FIG. 2, edge 143 of heat spreader 140 contains, in addition to step 144, a step 145 located above contact area 127. FIG. 2 thus illustrates a single-piece two-step design for heat spreader 140. In FIG. 3, heat spreader 140 comprises a piece 341 and a piece 342. In the illustrated embodiment, piece 341 comprises a cap and piece 342 comprises a base of the heat spreader that makes contact with substrate 120 at contact area 127 and makes contact with substrate 130 at contact area 137. FIG. 3 thus illustrates a two-piece, two-step design for heat spreader 140. In FIG. 4, heat spreader 140 again comprises piece 341 and 342, but these have a slightly different arrangement and, in the case of piece 342, a different shape, as illustrated. It should be understood, based on these examples, that many other heat spreader configurations are also possible.

Figure 5:
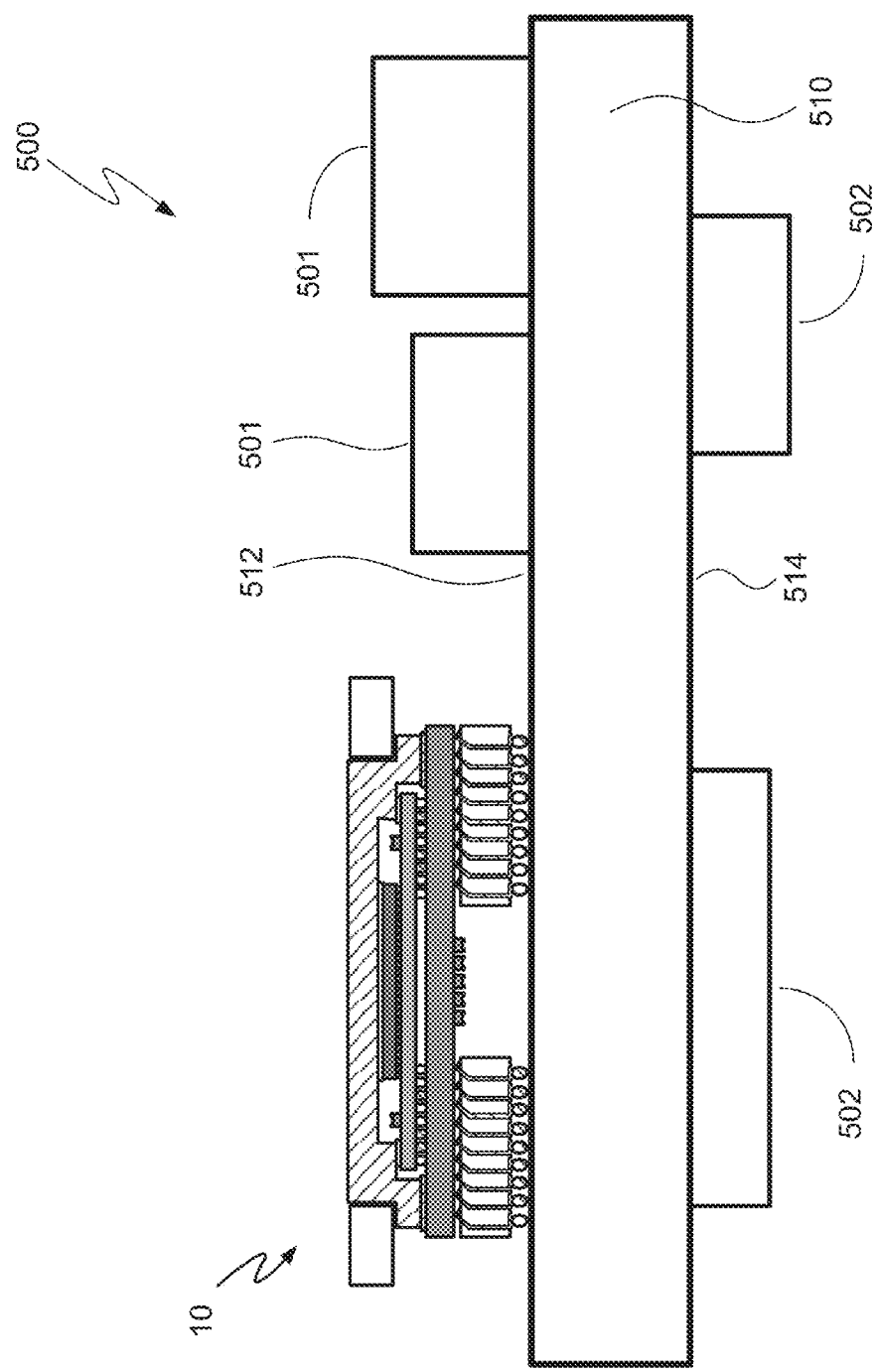
FIG. 5 is a schematic illustration of a computing system including an integrated circuit package according to an embodiment of the invention.

FIG. 5 is a schematic illustration of a computing system 500 according to an embodiment of the invention. System 500 includes a number of components disposed on a system board 510 or other circuit board. Board 510 includes a side 512 and an opposing side 514, and various components may be disposed on either one or both of sides 512 and 514. In the illustrated embodiment, socket 50 of microelectronic assembly 10 is integrated into board 510, and computing system 500 includes microelectronic assembly 10 disposed on side 512. The microelectronic assembly may comprise any of the embodiments described herein.

System 500 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Board 510 may comprise any suitable type of circuit board or other substrate capable of providing electrical communication between one or more of the various components disposed on the board. In one embodiment, for example, board 510 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with board 510. However, it should be understood that the disclosed embodiments are not limited to the above-described PCB and, further, that board 510 may comprise any other suitable substrate.

In addition to microelectronic assembly 10, one or more additional components may be disposed on either one or both sides 512, 514 of board 510. By way of example, and as shown in the figure, components 501 may be disposed on side 512 of board 510, and components 502 may be disposed on the board's opposing side 514. Additional components that may be disposed on board 510 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices. In one embodiment, computing system 500 includes a radiation shield. In a further embodiment, computing system 500 includes a cooling solution. In yet another embodiment, computing system 500 includes an antenna. In yet a further embodiment, system 500 may be disposed within a housing or case. Where board 510 is disposed within a housing, some of the components of computer system 500—e.g., a user interface device, such as a display or keypad, and/or a power supply, such as a battery—may be electrically coupled with board 510 (and/or a component disposed on this board) but may be mechanically coupled with the housing.

Figure 6:
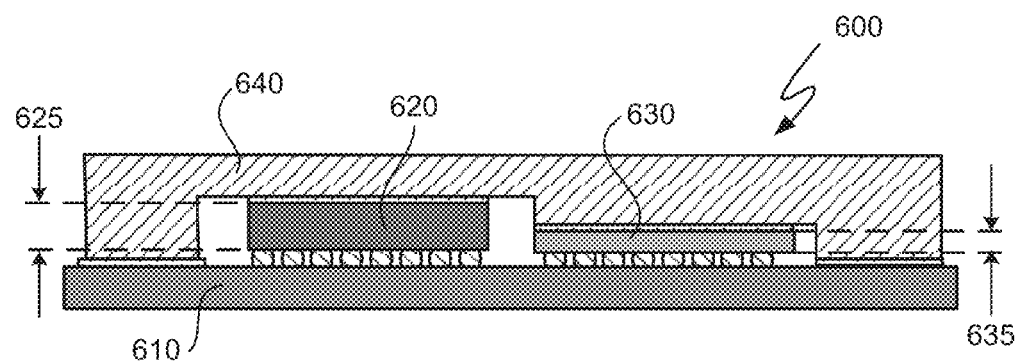
FIGS. 6 and 7 are cross-sectional views of a microelectronic system according to various embodiments of the invention.

Embodiments of the invention are not limited to PoINT architectures and packages, and may, for example, have value in any construction where multiple steps are involved, such as a construction having a CPU package mounted on a board and, say, a die or a chip scale package mounted on the same board, with an IHS covering both components. An example is shown in FIG. 6, which is a cross-sectional view of a microelectronic system 600 according to an embodiment of the invention. As illustrated, in FIG. 6, microelectronic system 600 comprises a system board 610, a microelectronic package 620 having a height 625, a microelectronic package 630 having a (different) height 635, and a heat spreader 640 that makes contact with both microelectronic package 620 and microelectronic package 630. Heat spreader 640 may or may not include a step analogous to step 144 of heat spreader 140 (as shown, for example, in FIG. 1a).

Figure 7:
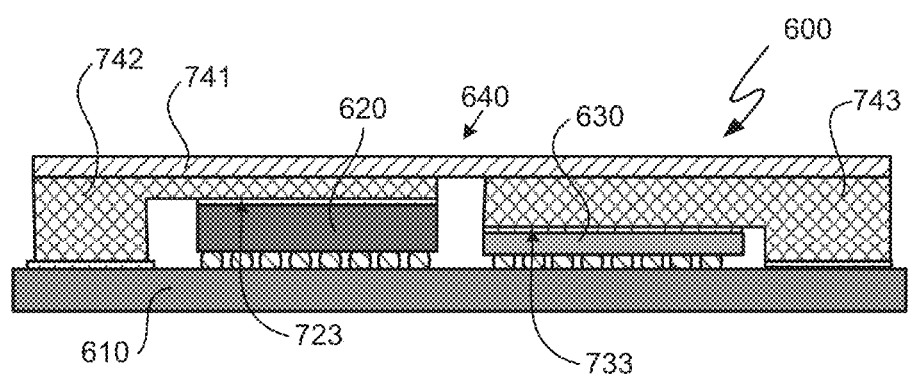

FIG. 7 is a cross-sectional view of system 600 according to an alternative embodiment. As illustrated in FIG. 7, heat spreader 640 comprises a cap 741, a base 742, and a base 743. Base 742 makes contact with microelectronic package 620 at a package contact region 723 and base 743 makes contact with microelectronic package 630 at a package contact region 733.

Figure 8:
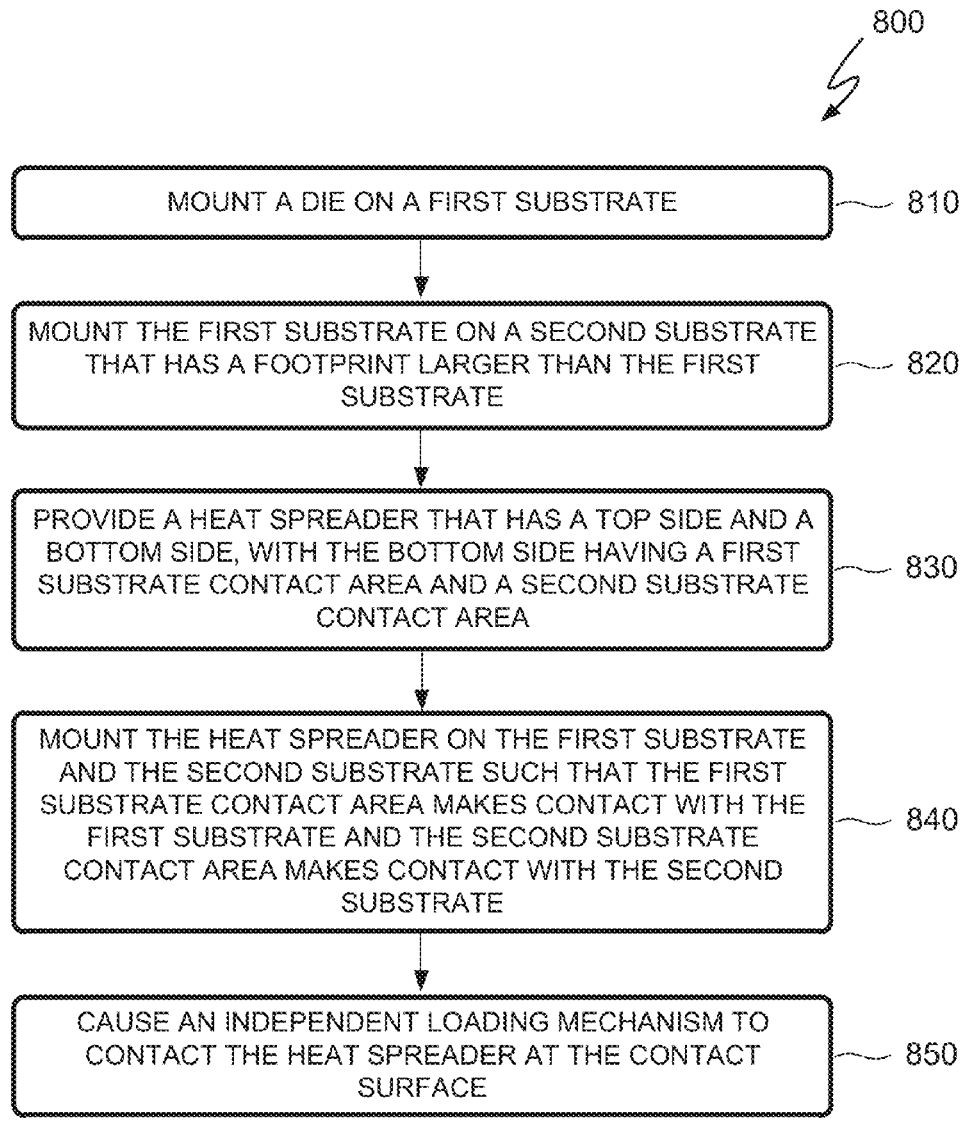
FIG. 8 is a flowchart illustrating a method of reducing die stress in a microelectronic package according to an embodiment of the invention.

FIG. 8 is a flowchart illustrating a method 800 of reducing die stress in a microelectronic package according to an embodiment of the invention. To the extent that method 800 includes mounting or other steps that are standard, such steps may be accomplished using any suitable technique as known in the art.

A step 810 of method 800 is to mount a die on a first substrate. As an example, the die can be similar to die 110 and the first substrate can be similar to substrate 120, both of which are first shown in FIG. 1a. Accordingly, a first surface of the first substrate comprises a first side, a second side opposite the first side, a third side extending between the first side and the second side, and a fourth side opposite the third side.

A step 820 of method 800 is to mount the first substrate on a second substrate that has a footprint larger than the first substrate. As an example, the second substrate can be similar to substrate 130 that is first shown in FIG. 1a. Accordingly, a first surface of the second substrate comprises a fifth side, a sixth side opposite the fifth side, a seventh side extending between the fifth side and the sixth side, and an eighth side opposite the seventh side.

A step 830 of method 800 is to provide a heat spreader that has a top side and a bottom side, with the bottom side having a first substrate contact area and a second substrate contact area. As an example, the heat spreader can be similar to heat spreader 140, first shown in FIG. 1a, and the first and second substrate contact areas can be similar to, respectively, contact areas 127 and 137, both of which are also first shown in FIG. 1a.

A step 840 of method 800 is to mount the heat spreader on the first substrate and the second substrate such that the first substrate contact area makes contact with the first substrate and the second substrate contact area makes contact with the second substrate. In one embodiment, the heat spreader contains a step providing a contact surface located above the second substrate contact area. In the same or another embodiment, mounting the heat spreader further comprises mounting the heat spreader such that the first substrate contact area makes contact with the first substrate at two or more of the first side, the second side, the third side, and the fourth side and such that the second substrate contact area makes contact with the second substrate only at the fifth side and the sixth side and not at the seventh side and the eighth side. In a different embodiment, mounting the heat spreader further comprises mounting the heat spreader such that the first substrate contact area makes contact with the first substrate only at the first side and the second side and not at the third side and the fourth side and such that the second substrate contact area makes contact with the second substrate at two or more of the fifth side, the sixth side, the seventh side, and the eighth side.

A step 850 of method 800 is to cause an independent loading mechanism to contact the heat spreader at the contact surface.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the integrated circuit package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims: and (2) are or are potentially equivalents of express elements and/or limitations in the claims under the doctrine of equivalents.

What is claimed is:

1. A package for a microelectronic die, the package comprising:
    a first substrate adjacent to a first surface of the die;
    a second substrate adjacent to the first substrate; and
    a heat spreader adjacent to a second surface of the die, wherein the heat spreader makes contact with both the first substrate and the second substrate, wherein:
        the first surface of the first substrate comprises a first side, a second side opposite the first side, a third side extending between the first side and the second side, and a fourth side opposite the third side;
        the second substrate comprises a first surface and an opposing second surface, where the first surface of the second substrate is adjacent to the second surface of the first substrate;
        the first surface of the second substrate comprises a fifth side, a sixth side opposite the fifth side, a seventh side extending between the fifth side and the sixth side, and an eighth side opposite the seventh side; and
        the heat spreader makes contact with the first substrate at two or more of the first side, the second side, the third side, and the fourth side, and makes contact with the second substrate only at the fifth side and the sixth side and not at the seventh side and the eighth side.

2. The package of claim 1 wherein:
the first surface of the die defines a first plane;
the heat spreader makes contact with the first substrate at a first substrate contact area and makes contact with the second substrate at a second substrate contact area; and
the first substrate contact area is located in the first plane and the second substrate contact area is located in a second plane that is parallel to the first plane.

3. The package of claim 1 wherein:
the first substrate comprises a first surface and an opposing second surface, where the first surface of the first substrate is adjacent to the first surface of the die and the second surface of the first substrate is adjacent to the second substrate;
the first substrate comprises a first plurality of interconnects having a first pitch at the first surface of the first substrate and a second plurality of interconnects having a second pitch at the second surface of the first substrate; and
the first pitch is smaller than the second pitch.

4. The package of claim 1 wherein:
the first surface of the first substrate comprises a first side, a second side opposite the first side, a third side extending between the first side and the second side, and a fourth side opposite the third side;
the second substrate comprises a first surface and an opposing second surface, where the first surface of the second substrate is adjacent to the second surface of the first substrate;
the first surface of the second substrate comprises a fifth side, a sixth side opposite the fifth side, a seventh side extending between the fifth side and the sixth side, and an eighth side opposite the seventh side; and
the heat spreader makes contact with the first substrate only at the first side and the second side and not at the third side and the fourth side, and makes contact with the second substrate at two or more of the fifth side, the sixth side, the seventh side, and the eighth side.

5. The package of claim 1 wherein:
the heat spreader makes contact with the second substrate at a second substrate contact area located at an edge of the heat spreader; and
the edge of the heat spreader contains a step located above the second substrate contact area.

6. The package of claim 5 wherein:
the heat spreader makes contact with the first substrate at a first substrate contact area located at the edge of the heat spreader; and
the edge of the heat spreader contains a second step located above the first substrate contact area.

7. The package of claim 5, wherein:
the contact surface is co-planar with the first surface of the die.

8. The package of claim 1 wherein:
the heat spreader comprises a first piece and a second piece;
the first piece comprises a cap;
the second piece comprises a base that makes contact with the first substrate at a first substrate contact area and makes contact with the second substrate at a second substrate contact area; and
the second piece contains a step located above the second substrate contact area.

9. A microelectronic assembly comprising:
an integrated circuit package;
a socket compatible with the integrated circuit package; and
an independent loading mechanism,
wherein:
the integrated circuit package comprises:
a die;
a first substrate;
a second substrate; and
a heat spreader that makes contact with both the first substrate and the second substrate;

the heat spreader comprises a step providing a contact surface; and the independent loading mechanism makes contact with the heat spreader at the contact surface.

10. The microelectronic assembly of claim 9 wherein:

the first substrate comprises a first surface and an opposing second surface, where the first surface of the first substrate is adjacent to a first surface of the die and the second surface of the first substrate is adjacent to the second substrate;

the first substrate comprises a first plurality of interconnects having a first pitch at the first surface of the first substrate and a second plurality of interconnects having a second pitch at the second surface of the first substrate; and the first pitch is smaller than the second pitch.

11. The microelectronic assembly of claim 9 wherein:

the first surface of the first substrate comprises a first side, a second side opposite the first side, a third side extending between the first side and the second side, and a fourth side opposite the third side;

the second substrate comprises a first surface and an opposing second surface, where the first surface of the second substrate is adjacent to the second surface of the first substrate;

the first surface of the second substrate comprises a fifth side, a sixth side opposite the fifth side, a seventh side extending between the fifth side and the sixth side, and an eighth side opposite the seventh side; and the heat spreader makes contact with the first substrate at two or more of the first side, the second side, the third side, and the fourth side, and makes contact with the second substrate only at the fifth side and the sixth side and not at the seventh side and the eighth side.

12. The microelectronic assembly of claim 9 wherein:

the first surface of the first substrate comprises a first side, a second side opposite the first side, a third side extending between the first side and the second side, and a fourth side opposite the third side;

the second substrate comprises a first surface and an opposing second surface, where the first surface of the second substrate is adjacent to the second surface of the first substrate;

the first surface of the second substrate comprises a fifth side, a sixth side opposite the fifth side, a seventh side extending between the fifth side and the sixth side, and an eighth side opposite the seventh side; and the heat spreader makes contact with the first substrate only at the first side and the second side and not at the third side and the fourth side, and makes contact with the second substrate at two or more of the fifth side, the sixth side, the seventh side, and the eighth side.

13. The microelectronic assembly of claim 9 wherein:

the heat spreader comprises a first piece and a second piece;

the first piece comprises a cap;

the second piece comprises a base that makes contact with the first substrate at a first substrate contact area and makes contact with the second substrate at a second substrate contact area; and the step providing the contact surface is located above the second substrate contact area.

14. The microelectronic assembly of claim 9 further comprising:

a system board into which the socket is integrated.

15. A method of reducing die stress in a microelectronic package, the method comprising:

mounting a die on a first substrate;

mounting the first substrate on a second substrate that has a footprint larger than the first substrate;

providing a heat spreader that has a top side and a bottom side, wherein the bottom side has a first substrate contact area and a second substrate contact area; and mounting the heat spreader on the first substrate and the second substrate such that the first substrate contact area makes contact with the first substrate and the second substrate contact area makes contact with the second substrate, wherein:

a first surface of the die defines a first plane;

the first substrate contact area is located in the first plane and the second substrate contact area is located in a second plane that is parallel to the first plane;

the heat spreader contains a step providing a contact surface located in the first plane above the second substrate contact area; and the method further comprises causing an independent loading mechanism to contact the heat spreader at the contact surface.

16. A method of reducing die stress in a microelectronic package, the method comprising:

mounting a die on a first substrate;

mounting the first substrate on a second substrate that has a footprint larger than the first substrate;

providing a heat spreader that has a top side and a bottom side, wherein the bottom side has a first substrate contact area and a second substrate contact area; and mounting the heat spreader on the first substrate and the second substrate such that the first substrate contact area makes contact with the first substrate and the second substrate contact area makes contact with the second substrate, wherein:

a first surface of the first substrate comprises a first side, a second side opposite the first side, a third side extending between the first side and the second side, and a fourth side opposite the third side;

a first surface of the second substrate comprises a fifth side, a sixth side opposite the fifth side, a seventh side extending between the fifth side and the sixth side, and an eighth side opposite the seventh side; and mounting the heat spreader further comprises mounting the heat spreader such that the first substrate contact area makes contact with the first substrate at two or more of the first side, the second side, the third side, and the fourth side and such that the second substrate contact area makes contact with the second substrate only at the fifth side and the sixth side and not at the seventh side and the eighth side.

17. A package for a microelectronic die, the package comprising:

a first substrate adjacent to a first surface of the die;

a second substrate adjacent to the first substrate; and a heat spreader adjacent to a second surface of the die, wherein the heat spreader makes contact with both the first substrate and the second substrate, wherein:

the first surface of the first substrate comprises a first side, a second side opposite the first side, a third side extending between the first side and the second side, and a fourth side opposite the third side;

the second substrate comprises a first surface and an opposing second surface, where the first surface of the second substrate is adjacent to the second surface of the first substrate;

the first surface of the second substrate comprises a fifth side, a sixth side opposite the fifth side, a seventh side extending between the fifth side and the sixth side, and an eighth side opposite the seventh side; and the heat spreader makes contact with the first substrate only at the first side and the second side and not at the third side and the fourth side, and makes contact with the second substrate at two or more of the fifth side, the sixth side, the seventh side, and the eighth side.

* * * * *